United States Patent
Sicong et al.

(10) Patent No.: US 7,868,724 B2
(45) Date of Patent: Jan. 11, 2011

(54) METHOD FOR SUPPRESSING COMMON MODE NOISE

(75) Inventors: Lin Sicong, Shanghai (CN); Zhou Min, Shanghai (TW); He Jun Ping, Shanghai (TW); Wei Chen, Beijing (CN); Jianping Ying, Shanghai (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 1232 days.

(21) Appl. No.: 11/338,680

(22) Filed: Jan. 25, 2006

(65) Prior Publication Data

US 2007/0171585 A1 Jul. 26, 2007

(51) Int. Cl.
*H01F 27/36* (2006.01)

(52) U.S. Cl. .................................... 336/84 R

(58) Field of Classification Search ............. 336/65, 336/83, 84 R, 84 C, 84 M, 200, 206
See application file for complete search history.

(56) References Cited

U.S. PATENT DOCUMENTS

| | | | | |
|---|---|---|---|---|
| 4,041,364 A | * | 8/1977 | Gauper, Jr. | 363/15 |
| 4,089,049 A | * | 5/1978 | Suzuki et al. | 363/17 |
| 4,335,423 A | * | 6/1982 | Koizumi et al. | 363/21.16 |
| 4,602,308 A | * | 7/1986 | Montague | 361/91.5 |
| 6,727,793 B2 | * | 4/2004 | Piechnick | 336/198 |
| 7,495,539 B2 | * | 2/2009 | Sundaram | 336/208 |

FOREIGN PATENT DOCUMENTS

JP 07045451 A * 2/1995

\* cited by examiner

*Primary Examiner*—Tuyen Nguyen
(74) *Attorney, Agent, or Firm*—Muncy, Geissler, Olds & Lowe, PLLC

(57) ABSTRACT

The present invention discloses a power converter with low common mode noise. The power converter having a primary side and a secondary side, comprises a transformer having a primary winding and a secondary winding, and at least one electrostatic shield disposed between the primary winding and the secondary winding, wherein the electrostatic shield is configured with partial first region of the primary winding and partial second region of the secondary winding such that the electrostatic shield partially shields with the primary winding and the secondary winding to reach the purpose of suppressing the common mode noise. In addition, another method can be used to reduce the common mode noise of a power converter having primary side and secondary side, which is adding some additional impedance between the static points and jump points of the primary side and secondary side.

10 Claims, 5 Drawing Sheets

METHOD FOR SUPPRESSING COMMON MODE NOISE

BACKGROUND OF THE INVENTION

1. Field of the Invention

The present invention relates to methods for suppressing common mode noise of the power converter.

2. Description of the Related Art

Currently, switching mode power supply must meet EMI international standard such that filters become necessities. In general, conductive EMI noise comprises differential mode noise and common mode noise. The current-loop of the differential mode noise is formed between Live wire (L) and Neutral (N) wire, and its value is related to the magnitude of ripple current of input of the power supply. The current-loop of the common mode noise is formed between power supply Live wire (L)/Neutral (N) wire and ground, and which is produced by high current (i=C*dv/dt) of discharging and charging on parasitic capacitors. In filter design, the differential mode noise can be suppressed by differential mode inductor and X capacitor, and the common mode noise can be suppressed by common mode inductor and Y capacitor.

Nowadays, though the common mode inductor and Y cap can be used to reduce the common mode noise, the size of them is still a big problem in the high requirement of power density of power supply. Accordingly, it is needed to reduce the original noise of the power supply to meet the requirement. Moreover, J.P. patent No. 05-153782 entitled "Noise Preventive Device" issued on Jun. 18, 1993 to NOMURA TOSHIHIRO teaches a reduced noise power converter which is provided by adding a noise preventive circuit for canceling a noise current flowing to a parasitic capacitance between a power converter circuit and a metal case. In addition, U.S. Pat. No. 5,724,236 entitled "Power converter transformer having an auxiliary winding and electrostatic shield to suppress noise" issued on Mar. 3, 1998 to Oglesbee and John W. teaches a reduced noise power converter.

Currently, some of the methods for reducing common mode noise of the power supply comprise the following: 1. Adapting symmetrical circuit structure, such as full bridge converter, push-pull converter. Voltage jump points of such circuits have the properties of the same magnitude, reverse-complement phase and hence common mode noise is smaller. 2. Utilizing two asymmetrical circuits such as two half-bridge converter for executing reverse-complement operating. During operation, when one converter creates positive voltage jump to charge on parasitic capacitors, another converter creates negative voltage jump to discharge on the parasitic capacitors, if charging current and discharging current are substantially the same, then common mode current passing through ground is almost zero and hence common mode noise detected on LISN is smaller. 3. Suppressing common mode noise using reverse-voltage principle between driving voltage and switching voltage. In general, the driving voltage is smaller than the switching voltage and hence capacitance of an external capacitor is adjusted to acquire common mode current of the same magnitude and reverse phase. 4. Adapting for compensation method, i.e. making a reverse-complement phase voltage on an original converter structure, utilizing common mode current produced by the above voltage balancing the common mode current of the original converter to get a smaller total common mode noise. The reverse-complement phase voltage can be produced by applying an external transformer or amplifier, or produced by applying an additional winding on main transformer. 5. Adding Faraday shield between the transformer's windings to reduce parasitic capacitance of primary side relative to secondary side of the transformer to acquire a smaller common mode noise.

Although all the aforementioned methods can reduce common mode noise produced by a voltage jump of primary side of the switching mode power supply, they do not mention common mode noise produced by another voltage jump of secondary side. Basing on our research, voltage jump of secondary side also affects common mode noise, especially when using normal Faraday shield, voltage jump of the secondary side may create a larger common mode noise than that produced by voltage jump of the primary side.

Therefore, in view of the above-mentioned drawbacks of prior art, new schemes and methods can be provided to achieve a smaller common mode noise.

SUMMARY OF THE INVENTION

In view of the drawbacks of prior art, the present invention provides methods to get low common mode noise by utilizing secondary side noise balancing the primary side noise.

In general, for the purpose of EMI reduction a transformer has a full Faraday shield as shown in FIG. 2. And this invention presents the first embodiment, that is, a transformer with a partial electrostatic shield between primary and secondary windings which covers partial area of primary winding and secondary winding.

The electrostatic shield may have a length-orientation gap region as shown in FIG. 3. Adjusting the length of the gap can change the parasitic capacitance $C_p$ & $C_s$ so as to meet the equation $V_p*C_p=V_s*C_s$ thus reduce common mode noise. For example, when the top view of the transformer is a circle, wherein $l_1$ is the length of the electrostatic shield, $l_2$ is the length of the gap region, $l_1$ and $l_2$ are determined by the equations $l_1=(2\pi-\theta)*d/2$, $l_2=\theta*d/2$ respectively, wherein the $\theta$, d represent gap angle of the gap region and diameter of the electrostatic shield respectively.

And the electrostatic shield can also have a width-orientation gap region x, y as shown in FIG. 5, adjusting x, y to reduce common mode noise, wherein $x+y \geq 2$ mm.

And part of the acreage of the shield can be replaced by another kind of material e.g. those whose permittivity is different from that of the shield adjusting the acreage of the area to reduce common mode noise.

Despite of the above mentioned methods, modifying the distance between the primary winding, secondary winding and shield e.g. modifying the thickness of the shield, changing the layers of the dielectric material wrapped around the shield can also change $C_p$ and $C_s$, thus meets the requirement.

The present invention also discloses another embodiment for reduction of common mode noise. For a power converter, noise voltages which have jump point and static point is produced for the turning on and off of the switches. Adding a balancing capacitor between the jump point and static point of the noise voltage can reduce the common mode noise.

BRIEF DESCRIPTION OF THE DRAWINGS

For a better understanding of the present invention and to show how it may be carried into effect, reference will now be made to the following drawings, which show the preferred embodiments of the present invention, in which.

DESCRIPTION OF THE PREFERRED EMBODIMENTS

In the following description, numerous specific details are set forth in order to provide a thorough understanding of the present invention, and the scope of the present invention is expressly not limited but expected as specified in the accompanying claims. One skilled in the relevant art will recognize, however, that the invention may be practiced without one or more of the specific details. In other instances, well known structures, materials, or operations are not shown or described in order to avoid obscuring aspects of the invention.

Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1:
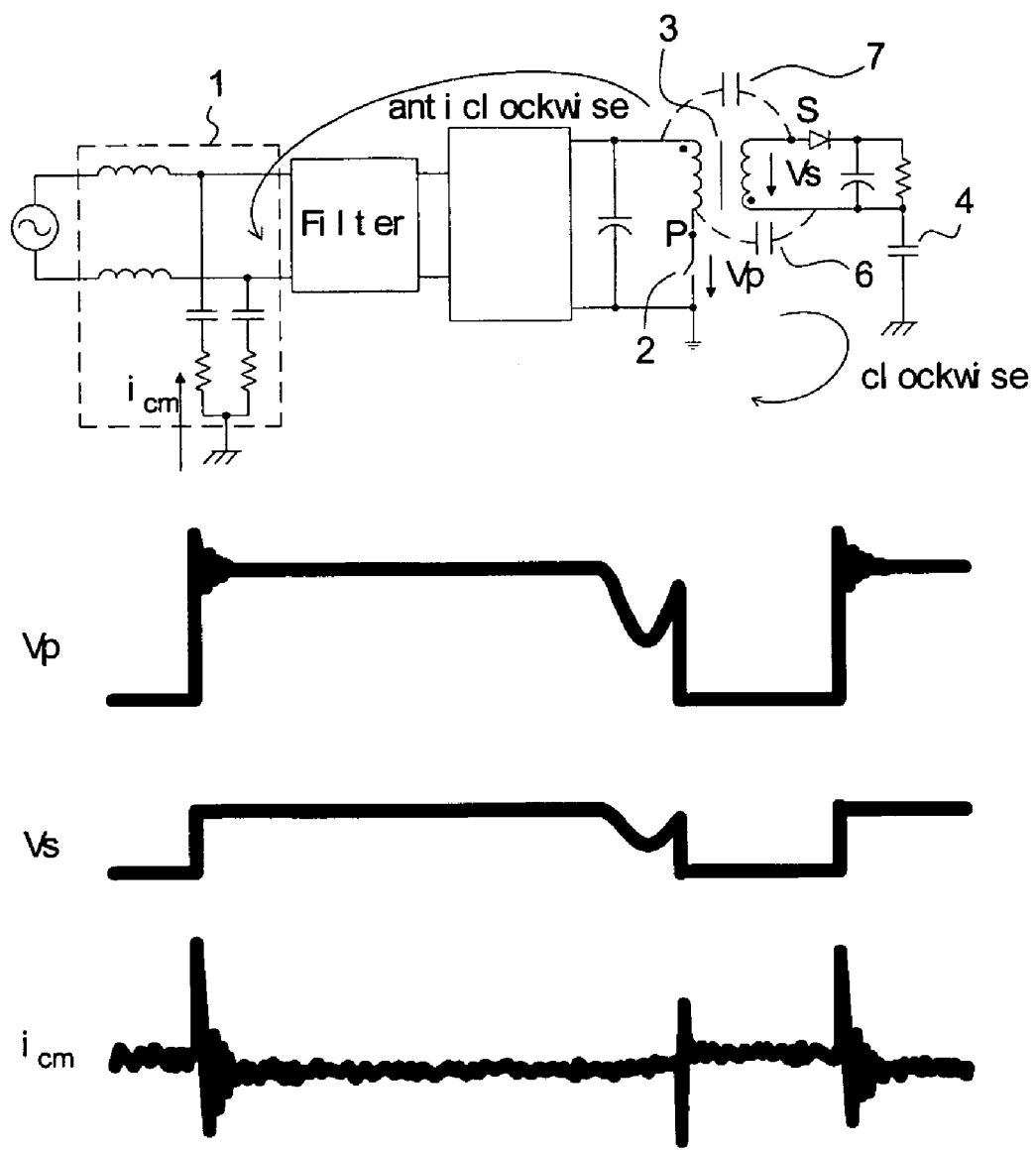
FIG. 1 shows a flyback converter topology and waveform of voltage jumps, and common mode current.

As it is well known that a power converter having a transformer has a primary and a secondary ground node. Generally, the secondary ground node is connected directly or maybe via a capacitor to the earth ground node, as shown in FIG. 1. For a power converter, all the nodes are jumping from high voltage level to low voltage level and vice versa. And the big difference between them is the operating frequency referred to the earth ground, for example, in FIG. 1 the operating frequency of the node P or S equals to the switching frequency while that of the primary and secondary ground is far less than the switching frequency. So the nodes which frequency equals to or is larger than the switching frequency are called the jump nodes or jump point while those less than switching frequency are called the static nodes or static points.

FIG. 1 shows a flyback converter topology and waveform of main voltage jumps, and common mode current of the converter. In the topology LISN 1 is a necessary equipment for testing conductive EMI which provides standard load impedance for a noise source of a device under test and separates noises produced by others electric equipments of the power supply network. Due to the operation of switch 2, a high dv/dt is produced on the circuits to form common mode current passing through parasitic capacitors 6, 7 of the transformer 3 and the capacitor 4 to the earth ground. Two voltage jump points P, S are provided on the circuits. $V_p$ represents terminal voltage of the switch 2 of the primary side, and $V_s$ represents terminal voltage of the secondary side. When the switch 2 is open, primary side jump voltage $V_p$ creates transient positive voltage jump to charge on parasitic capacitor 6 of the transformer 3 forming the clockwise common mode current. At the same time, secondary side jump voltage $V_s$ also creates transient positive voltage jump to charge on parasitic capacitor 7 of the transformer 3 forming an the anticlockwise common mode current. If $V_p$ is far higher than $V_s$, then the clockwise common mode current will be far higher than the anticlockwise common mode current, and a positive common mode current $i_{cm}$ will be tested on the LISN, shown in FIG. 1.

Similarly, when the switch 2 is closed, primary side voltage $V_p$ creates transient negative voltage jump to discharge on parasitic capacitor 6 of the transformer 3 forming an anticlockwise common mode current. At the same time, secondary side voltage $V_s$ also creates transient negative voltage jump to discharge on parasitic capacitor 7 of the transformer 3 forming a clockwise common mode current. If $V_p$ is far higher than $V_s$, then the anticlockwise common mode current will be far higher than the clockwise common mode current, and a negative common mode current will be shown on the LISN.

Figure 2:
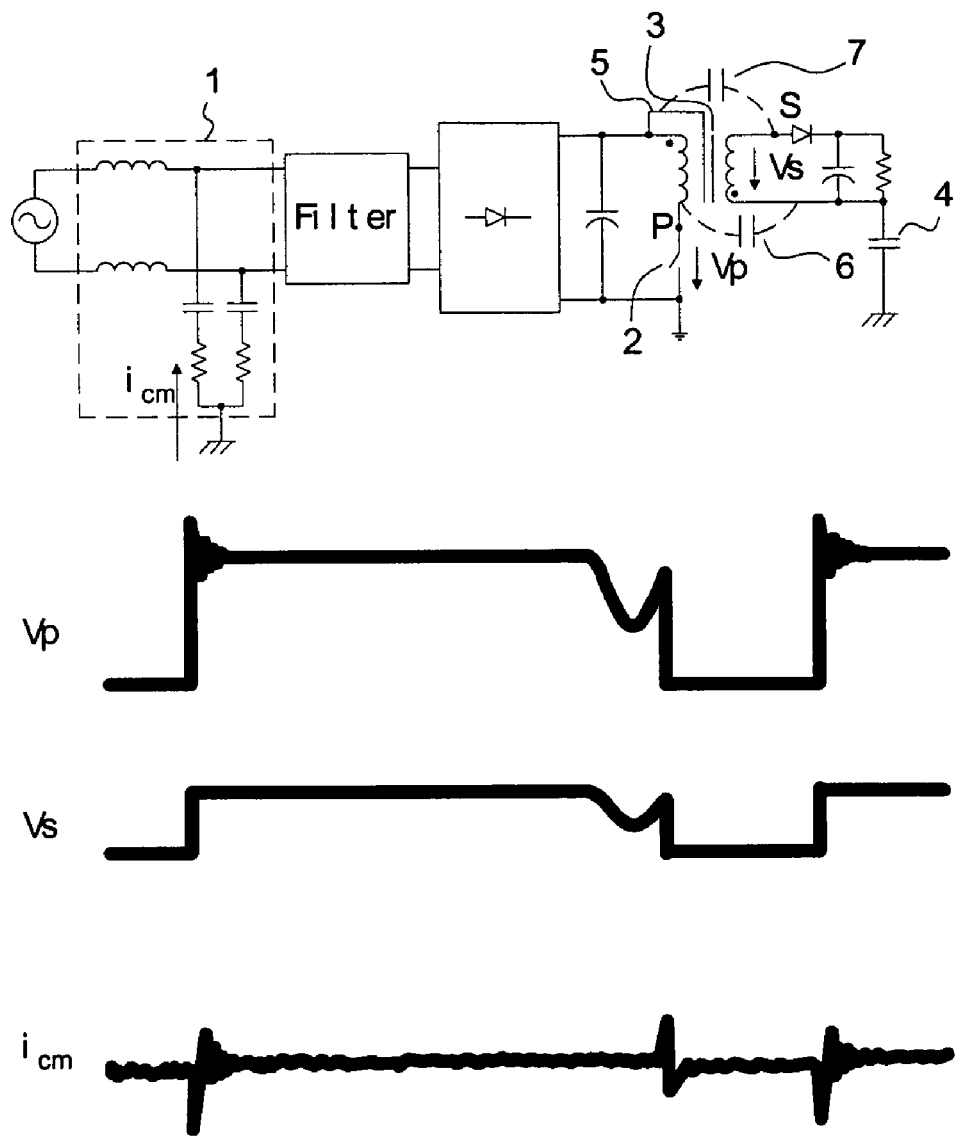
FIG. 2 shows a flyback converter topology with a full shield on primary side and waveform of voltage jumps, and common mode current.

In practical applications, main noise source exists in the primary side of the transformer 3, and therefore a shield, such as Faraday shield, is commonly applied to the transformer 3 to entirely shield the primary side. In other words, Faraday shield 5 is added between the primary and secondary winding of the transformer 3, and the Faraday shield 5 is coupled to ground of the primary side or positive terminal of bus capacitor of the primary side, shown in FIG. 2. In such condition, equivalent parasitic capacitor 6 of the primary side relative to the secondary side of the transformer 3 will be reduced, and therefore common mode current produced by the primary side noise source is enormously reduced. While the equivalent parasitic capacitor 7 of the secondary side relative to the primary side of the transformer 3 will be higher than capacitor 6, and therefore the common mode current got by the LISN is mainly produced by voltage jump of the secondary side, especially apparently in larger secondary side voltage $V_s$ condition, shown in FIG. 2.

From the above analysis, it is noted that voltage jump of the secondary side will affect common mode noise of the power supply. The present invention provides new methods for suppressing common mode noise of the power converter. The operational principle is utilized by balancing common mode noise created by the primary side jump voltage $V_p$ with common mode noise created by the secondary side jump voltage $V_s$ to acquire a total low common mode noise. The magnitude of the common mode noise relates to two factors, one is the magnitude of the voltage jump and the other is the magnitude of the parasitic capacitor. Therefore, when $V_p*C_p=V_s*C_s$, the smallest total common mode noise will be acquired, wherein $C_p$ represents equivalent parasitic capacitance of the primary side voltage jump relative to the ground or static point of the secondary side, and $C_s$ represents equivalent parasitic capacitance of the secondary side voltage jump relative to the ground or the static point of the primary side.

And it is known that the adjustment of the shielding area of the transformer can change $C_p$ and $C_s$, so the partial shielding method can be adapted to meet the requirement of the above equation ($V_p*C_p=V_s*C_s$). For example, length of the shield can be changed to acquire suitable $C_p$ and $C_s$.

Figure 3:
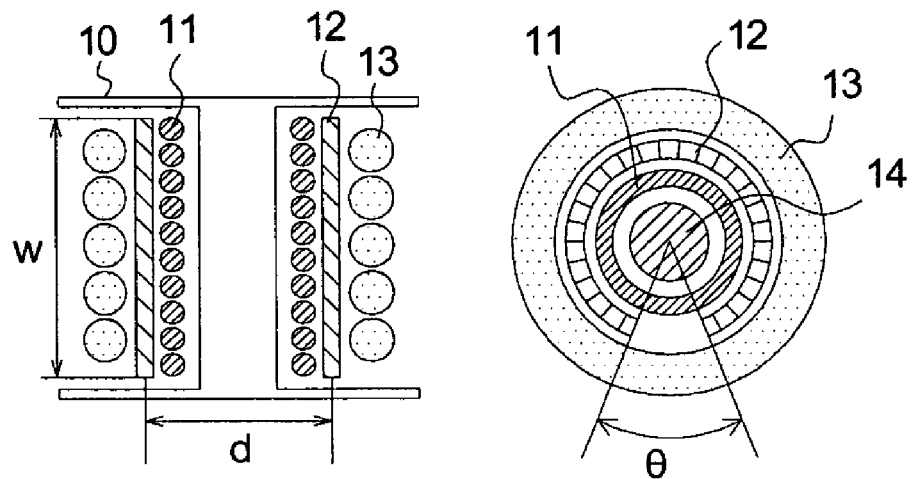
FIG. 3 shows a cross-sectional view and top view of a transformer with a length-orientation-gap shielding according to the present invention.

FIG. 3 shows a cross-sectional view and top view of a transformer with a length-orientation-gap shielding according to the present invention. The winding configuration of the transformer shown in FIG. 3 is a simple structure. The transformer comprises a bobbin 10, a primary winding 11, a shield 12, a secondary winding 13 and magnetic core of the transformer 14. The shield 12 is length-orientation-gap shield configuration having a gap region different from the Faraday shield 5 shown in FIG. 2. In other words, the electrostatic shield 12 is configured with partial region of the primary winding and secondary winding of the transformer. The length of the shield 12 is defined by the equation $l_1=(2\pi-\theta)*d/2$, and gap length of the shield 12 is defined by the equation $l_2=\theta*d/2$. From the top view of the transformer, $\theta$ & d represent gap angle of the gap region and diameter of the electrostatic shield respectively. The length and gap length of the shield can be adjusted by above equations to acquire suitable $C_p$ and $C_s$. Here gap region is defined by free of shielding with said primary winding and said secondary winding.

In FIG. 3, the top view of the bobbin is a circle. In fact, lots of other shape e.g. rectangle, square are all be used.

Figure 4:
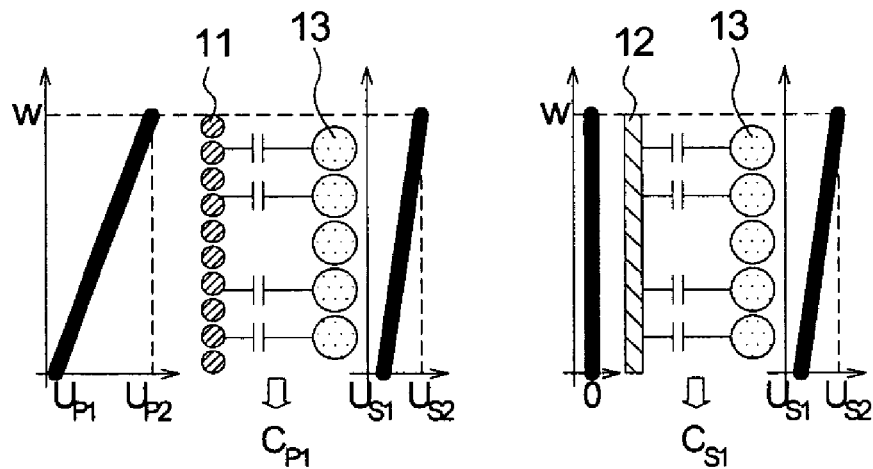
FIG. 4 shows a calculation of equivalent parasitic capacitors of a transformer with a length-orientation-gap shielding according to the present invention.
Figure 5:
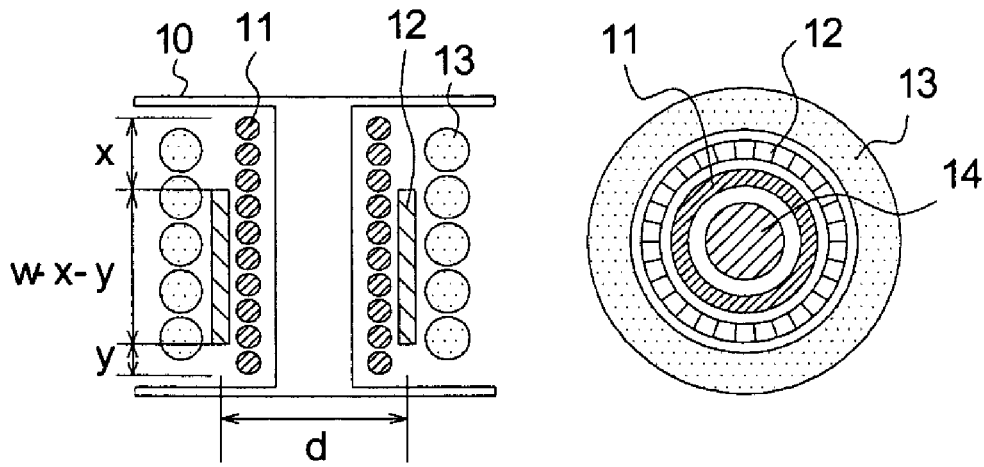
FIG. 5 shows a cross-sectional view and top view of a transformer with a width-orientation-gap shielding according to the present invention.

FIG. 4 shows the sketch map of the calculation of equivalent parasitic capacitors of a transformer with a length-orientation-gap shielding according to the present invention. In this scheme, main equivalent parasitic capacitor at gap region of the shield 12 equals to $C_p$ and main equivalent parasitic capacitor between the secondary winding and the shield 12 equals to $C_s$. During the operation of the transformer, voltage on each turn of the winding is different, and therefore calculation of equivalent parasitic capacitors of $C_p$ and $C_s$ must take into account the displacement currents concept and the windings voltage distribution, $U_{P1} \sim U_{P2}$ and $U_{S1} \sim U_{S2}$. As shown in FIG. 4, suppose voltage is linearly distributed along the windings, the equivalent parasitic capacitance of per unit length $C_{p1}$ and $C_{s1}$ can be calculated, then the total equivalent parasitic capacitance of $C_p$ and $C_s$ of the transformer can be determined by the equations $C_p=C_{p1}*l_2$, $C_s=C_{s1}*l_1$. In other words, angle $\theta$ or $l_1$, $l_2$ can be adjusted to change values of $C_p$ and $C_s$ to meet equation ($V_p*C_p=V_s*C_s$) such that common mode noise of the power supply is considerably reduced. Moreover, width w-x-y of the shield 12 of the transformer can also be adjusted to change values of $C_p$ and $C_s$ to meet equation ($V_p*C_p=V_s*C_s$), as shown in FIG. 5, wherein $x+y \geq 2$ mm, herein, 2 mm is a common safety distance which is used in the industrial field now. FIG. 5 shows a cross-sectional view and top view of a transformer with a width-orientation-gap shielding according to the present invention.

The above description shows the method to meet the equation ($V_p*C_p=V_s*C_s$) by modifying the length and width of the shield. In addition, the method of adjusting shield's area can also be used which replacing some part of the shield with another kind of material e.g. those whose permittivity is different from that of the shield. Despite of the above mentioned methods, modifying the distance between the primary winding, secondary winding and shield e.g. modifying the thickness of the shield, changing the layers of the dielectric material wrapped around the shield can also change $C_p$ and $C_s$, thus meets the requirement.

Figure 6:
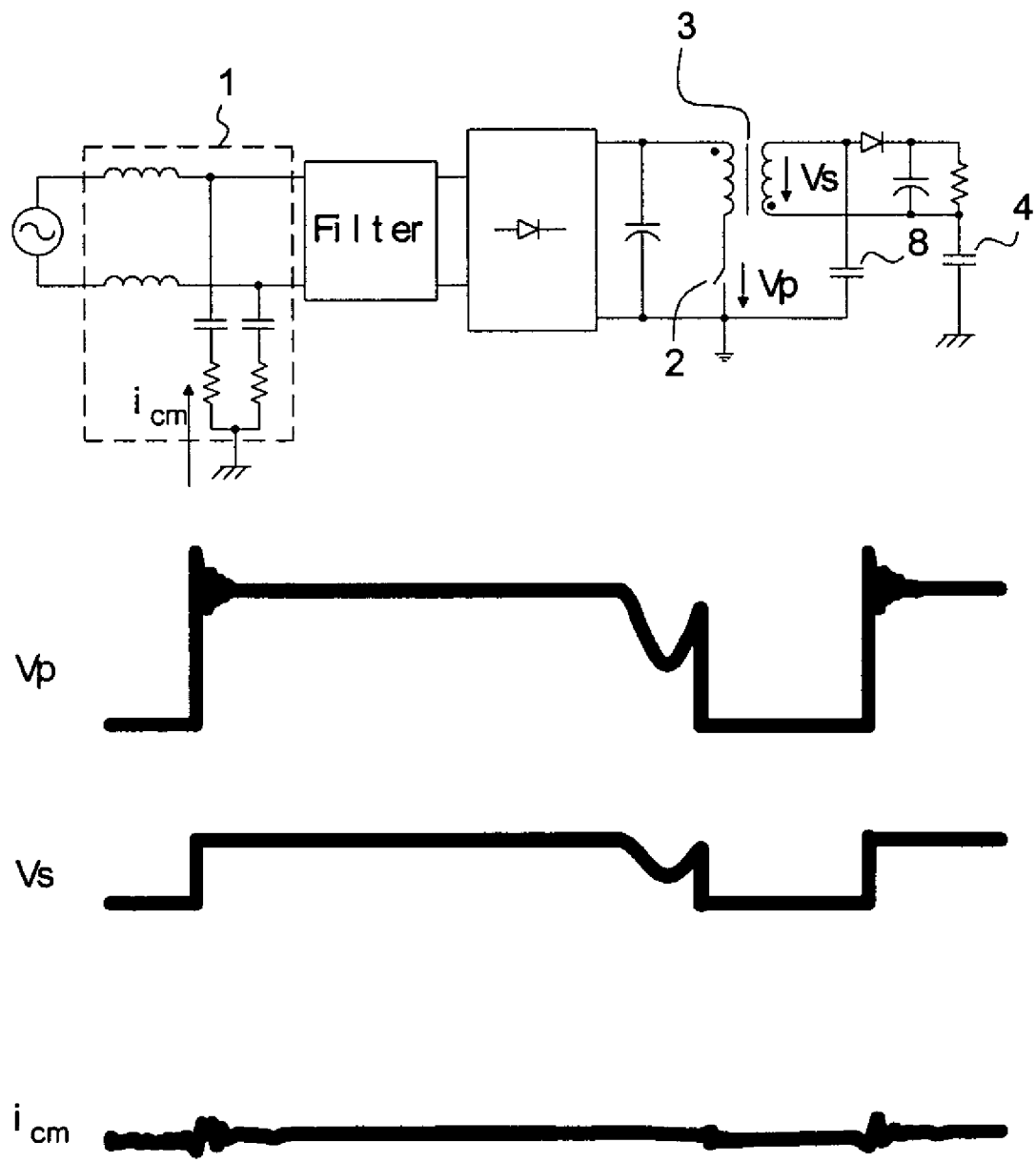
FIG. 6 shows a flyback converter topology with an additional balancing capacitor and waveform of voltage jumps, and common mode current.

FIG. 6 shows a flyback converter topology with an additional balancing capacitor and waveform of voltage jumps, and common mode current. In a transformer with shield or without shield condition, when $V_p*C_p \neq V_s*C_s$, an additional balancing capacitor $C_{add}$ 8 may be optionally added between the primary side and secondary side to balance the primary side noise and the secondary side noise. If the common mode noise is dominated by the primary side noise source, that is $V_p*C_p>V_s*C_s$, the equivalent parasitic capacitance of the secondary side voltage jump relative to the ground of the primary side $C_s$ needs to be increased for increasing secondary side noise so as to balance common mode noise of the primary side, shown in FIG. 6. The one node of the balancing capacitor 8 is coupled to voltage jump point of the secondary side and another node is coupled to ground of the primary side or positive terminal of bus capacitor of the primary side. In this common mode model, the balancing capacitor 8 is parallelly coupled with $C_s$ and determined by the equation $V_p*C_p=V_s*(C_s+C_{add})$. Similarly, if the common mode noise is dominated by the secondary side noise source, that is $V_p*C_p<V_s*C_s$, the equivalent parasitic capacitance of the primary side voltage jump relative to the ground of the secondary side $C_p$ needs to be increased for increasing primary side noise to balance the common mode noise of the secondary side.

Figure 7:
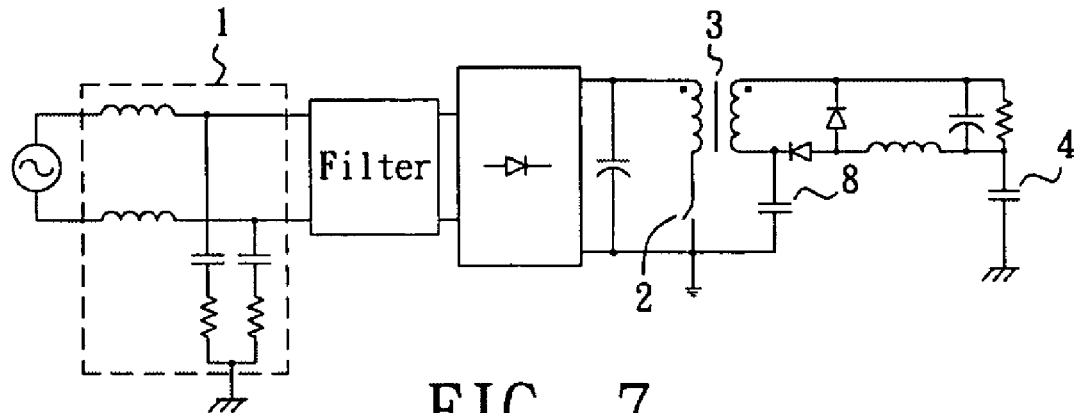
FIG. 7 shows a forward converter topology with an additional balancing capacitor.
Figure 8:
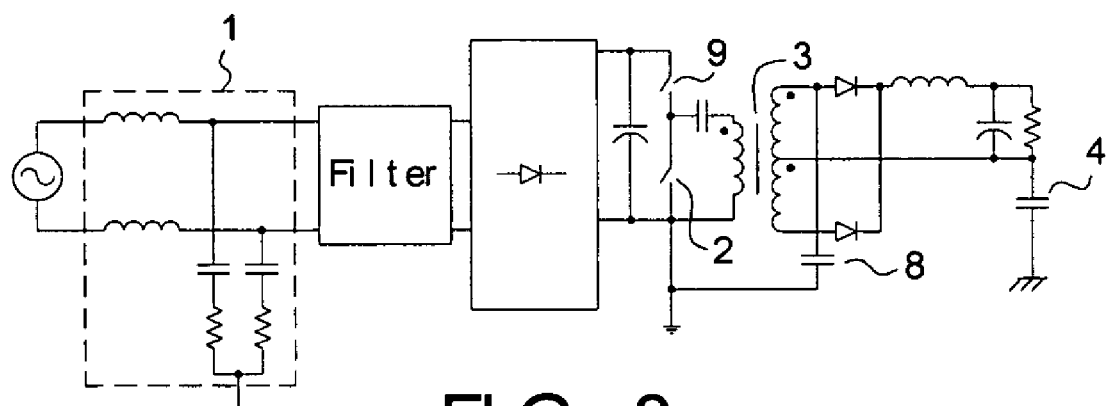
FIG. 8 shows an asymmetrical half-bridge converter topology with an additional balancing capacitor.
Figure 9:
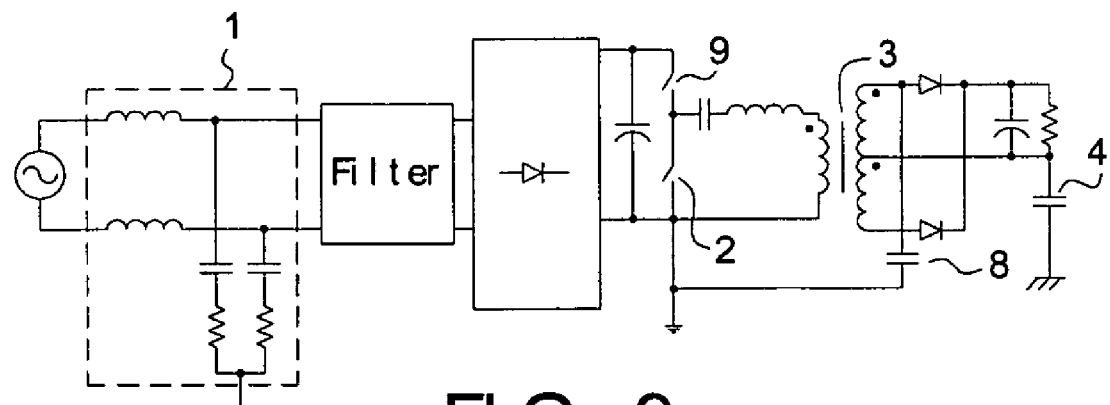
FIG. 9 shows a half-bridge LLC converter topology with an additional balancing capacitor.

Moreover, others application such as forward converter, asymmetrical half-bridge converter, half-bridge LLC converter etc. may be applied to the present invention, as shown in FIG. 7, FIG. 8 and FIG. 9 respectively. In voltage drop converter, method for suppressing common mode noise may be achieved by utilizing secondary side noise balancing the primary side noise with additional impedance, partial shielding of transformer or the combination thereof. In utilizing method of partial shielding of transformer, the configuration of the primary winding and said secondary winding of the transformer may be a simple structure, a sandwich structure or an interleave structure, and the primary winding and said secondary winding can parallelly or vertically configure. The number of the electrostatic shield may be one or more. Moreover, required values of the $C_p$ and $C_s$ may be acquired by adjusting the thickness, length, and width of the shield or area of the shield.

Therefore, in contrast with the prior art, the present invention provides new methods by utilizing secondary side noise to balance the primary side noise for the purpose of reducing the common mode noise.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A power converter having a primary side and a secondary side, comprising a transformer having a bobbin, a primary winding and a secondary winding, and at least one electrostatic shield configured between said primary winding and said secondary winding, wherein said electrostatic shield partially shields a first region of said primary winding and partially shields a second region of said secondary winding, and wherein said electrostatic shield has width-orientation gap region x, y; adjusting x, y to reduce common mode noise, wherein x is the distance between one end of the bobbin and one end of the electrostatic shield, y is the distance between the other end of the bobbin and the other end of the electrostatic shield, and $x+y \geq 2$ mm.

2. The power converter as in claim 1, wherein said electrostatic shield has a length-orientation gap region; adjusting the length of the gap to reduce common mode noise.

3. The power converter as in claim 2, wherein the top view of the transformer is a circle; l1 is the length of said electrostatic shield; l2 is the length of said gap region; l1 and l2 are determined by the equations $l1=(2\pi-\theta)*d/2$, $l2=\theta*d/2$ respectively, wherein said θ, d represent gap angle of said gap region and diameter of said electrostatic shield respectively.

4. The power converter as in claim 1, wherein said electrostatic shield comprises an electrostatic shield area and at least one part of the electrostatic shield area made of material which is different from the material of the rest electrostatic shield area for reducing common mode noise by means of adjusting the proportion of the acreage of the part and the rest electrostatic shield areas.

5. The power converter as in claim 1, wherein configuration of said primary winding and said secondary winding is a sandwich structure.

6. The power converter as in claim 1, wherein configuration of said primary winding and said secondary winding is an interleave structure.

7. The power converter as in claim 1, wherein said power converter comprises a flyback converter.

8. The power converter as in claim 1, wherein said power converter comprises a forward converter.

9. The power converter as in claim 1, wherein said power converter comprises a asymmetrical half-bridge converter.

10. The power converter as in claim 1, wherein said power converter comprises a half-bridge LLC converter.

* * * * *